United States Patent [19]
Shen

[11] Patent Number: 5,770,518
[45] Date of Patent: Jun. 23, 1998

[54] SEMICONDUCTOR DEVICE AND METHOD OF MANUFACTURING WITHOUT UNDERCUTTING CONDUCTIVE LINES

[75] Inventor: Lewis Shen, Cupertino, Calif.

[73] Assignee: Advanced Micro Devices, Inc., Sunnyvale, Calif.

[21] Appl. No.: 728,225

[22] Filed: Oct. 10, 1996

Related U.S. Application Data

[62] Division of Ser. No. 423,497, Apr. 19, 1995, Pat. No. 5,604,381.

[51] Int. Cl.[6] .................. H01L 21/4763; H01L 21/302
[52] U.S. Cl. ................... 438/631; 438/669; 438/720; 438/926
[58] Field of Search ............... 437/50, 189, 192, 437/194, 195, 228; 156/656.1; 438/622, 631, 669, 720, 926

[56] References Cited

U.S. PATENT DOCUMENTS

| | | | |
|---|---|---|---|
| 4,916,514 | 4/1990 | Nowak. | |
| 5,182,235 | 1/1993 | Eguchi | 437/187 |
| 5,441,915 | 8/1995 | Lee | 437/195 |
| 5,459,093 | 10/1995 | Kuroda et al. | 437/195 |
| 5,476,817 | 12/1995 | Numata | 437/195 |
| 5,500,076 | 3/1996 | Jerbic | 156/643.1 |

FOREIGN PATENT DOCUMENTS

| 5-3298 | 1/1993 | Japan . |
|---|---|---|
| 5-47764 | 2/1993 | Japan . |

*Primary Examiner*—Brian Dutton

[57] ABSTRACT

Undercutting of conductive lines in a dense array on a dielectric layer containing an open field is prevented by providing one or more non-functional components, such as one or more non-functional conductive lines, in the dielectric layer under the dense array of conductive lines.

19 Claims, 2 Drawing Sheets

SEMICONDUCTOR DEVICE AND METHOD OF MANUFACTURING WITHOUT UNDERCUTTING CONDUCTIVE LINES

This application is a division of application Ser. No. 08/423,497 filed Apr. 19, 1995 now U.S. Pat. No. 5,604,381.

TECHNICAL FIELD

The present invention relates to a method of manufacturing a semiconductor device wherein a dense array of conductive lines is etched without undercutting, and to the resulting semiconductor device.

BACKGROUND ART

The escalating requirements for high density and performance associated with ultra large scale integration require responsive changes in conductive patterns, which is considered one of the most demanding aspects of ultra large scale integration technology. High density demands for ultra large scale integration semiconductor wiring require increasingly denser arrays with minimal spacing between conductive lines. This objective becomes particularly difficult to achieve given the economic pressure for high speed production. Thus, the combined requirements of high speed and high density conductive wiring patterns pose a challenge which, to date, has not been satisfactorily achieved.

A traditional method for forming a dense array of conductive lines comprises the use of a subtractive etch back step as the primary metal-patterning technique. This traditional technique basically comprises forming a dielectric layer on a substrate, such as monocrystalline silicon, depositing a metal layer, such as aluminum, tungsten, polysilicon, tungsten silicide, or titanium silicide, forming a photo-resist mask having a pattern defining a dense array of conductive lines bordered by an open field wherein the distance between the conductive lines is considerably greater than the distance between conductive lines in the dense array, and etching through the mask. Typically, etching is conducted to optimize production speed as by utilizing an etching apparatus which generates a high density plasma, e.g., a high density chlorine plasma, which involves feeding chlorine gas, along with boron trichloride, into an etching apparatus, such as a Transformer Coupled Plasma (TCP) source type of apparatus. Model 9600, commercially available from Lam Research Corp., Fremont, Calif., has been found suitable. A high density plasma is generated with $Cl^-$ as the etching species. Etching is conducted until the metal is substantially removed between the conductive lines of the dense array along with any residues which may have formed, and the underlying oxide etched to ensure complete removal of conductive material between the conductive lines. Other types of etching apparatus, such as other high density plasma source types of apparatus, can be used. For example, etching can also be conducted with an Electron Cycletron Resonance (ECR) type apparatus or a Helicon Resonant Inductive coupled plasma source type apparatus.

As employed throughout this application, the expression "open field" denotes an area wherein conductive lines are separated by a distance of at least 2.0 microns, while the expression "dense array" denotes a pattern of conductive lines which are separated by a distance of less than 1.0 micron.

In co-pending application Ser. No. 08/368,170, filed Jan. 3, 1995, a method is disclosed for solving the undercutting problem of conductive lines in a dense array bordered by an open field by reducing the initial etching severity. The disclosed invention comprises changing one or more of the original etching conditions at a strategic point during etching. The etching process is monitored in a conventional manner, as by optical spectrum monitoring, until the conductive material is substantially removed from the open field between conductive lines, but conductive material remains between the conductive lines of the dense array. It is at this point that undercutting of the conductive lines in the dense array commences and, it is at this strategic point that the initial etching severity is reduced by changing one or more of the initial etching conditions.

Co-pending application Ser. No. 08/423,495, entitled SEMICONDUCTOR DEVICE AND METHOD OF MANUFACTURING USING HIGH DENSITY PLASMA ETCHING (Docket No. 1033-098), addresses the undercutting problem which occurs in conductive lines of a dense array bordered by an open field in a manner which does not require manipulation of the etching process parameters or modification of the etching apparatus. In co-pending application Ser. No. 08/423,495 (Docket No. 1033-098), a semiconductor device and method of manufacturing the semiconductor device is disclosed, wherein undercutting of conductive lines in a dense array bordered by an open field is avoided by providing one or more, preferably one, non-functional or dummy conductive lines in the open field, wherein the distance between all the conductive lines is, preferably, essentially the same, typically below 1.0 micron, most preferably below 0.7 microns. The use of one or more non-functional or dummy conductive lines advantageously reduces undercutting in a bordering dense array of conductive lines without requiring the manipulation of any process variable and is, hence, cost efficient.

Upon further investigation and experimentation, I found that upon high density plasma etching a conductive layer to form a dense array of conductive lines, the etching species exhibits a differential trajectory path within the dense array of conductive lines. This differential trajectory path results in undercutting of the dense array of conductive lines on a dielectric layer containing functional components, such as lower conductive lines, bordered by an open field. Thus, there exists a need to develop techniques which further minimizes undercutting of conductive lines in a dense array.

DISCLOSURE OF THE INVENTION

An object of the present invention is a semiconductor device exhibiting reduced undercutting of conductive lines in a dense array.

Another object of the present invention is a method of manufacturing a semiconductor device having a dense array of conductive lines by etching a conductive layer, wherein undercutting of the conductive lines is reduced.

Additional objects, advantages and other features of the invention will be set forth in part in the description which follows and in part will become apparent to those having ordinary skill in this art upon examination of the following or may be learned from practice of the invention. The objects and advantages of the invention may be realized and obtained as particularly pointed out in the appended claims.

According to the present invention, the foregoing and other objects are achieved in part by a semiconductor device comprising: a dielectric layer; a dense array of upper conductive lines on the dielectric layer, wherein the dielectric layer contains functional circuit components and one or more non-functional circuit components, and wherein the dense array of upper conductive lines on the dielectric layer extends over the functional circuit components and over the one or more non-functional circuit components.

Another aspect of the present invention is a method of manufacturing a semiconductor device: forming a dielectric layer containing functional circuit components bordered by one or more non-functional circuit components; forming a layer of conductive material on the dielectric layer extending over the functional and over the one or more non-functional circuit components; forming a mask on the conductive layer, which mask contains a pattern defining lines to constitute a dense array of upper conductive lines extending over the one or more functional and non-functional circuit components; and etching the conductive layer through the mask to form the dense array of upper conductive lines on the dielectric layer extending over the functional circuit components and over the one or more non-functional circuit components.

A further aspect of the present invention is a method of manufacturing a semiconductor device comprising: forming a first layer of conductive material on a substrate; forming a first mask on the first conductive layer, which first mask contains a pattern defining lines to constitute a dense array of functional lower conductive lines bordered by one or more non-functional conductive lines; etching the first conductive layer through the mask to form a plurality of lower conductive, lines; forming an electrical circuit with a portion of the lower conductive lines to form the dense array of functional lower conductive lines leaving one or more bordering non-functional lower conductive lines; depositing a layer of dielectric material; planarizing the layer of dielectric material; forming a second layer of conductive material on the planarized dielectric layer extending over the dense array of functional lower conductive lines and over the one or more bordering non-functional lower conductive lines; forming a second mask on the second conductive layer, which second mask contains a pattern defining lines to constitute a dense array of upper conductive lines extending over the dense array of functional lower conductive lines and over the one or more bordering non-functional lower conductive lines; and etching the second conductive layer through the mask to form the dense array of upper conductive lines on the dielectric layer extending over the dense array of functional lower conductive lines and bordering over the one or more non-functional lower conductive lines.

Additional objects and advantages of the present invention will become readily apparent to those having ordinary skill in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1A:
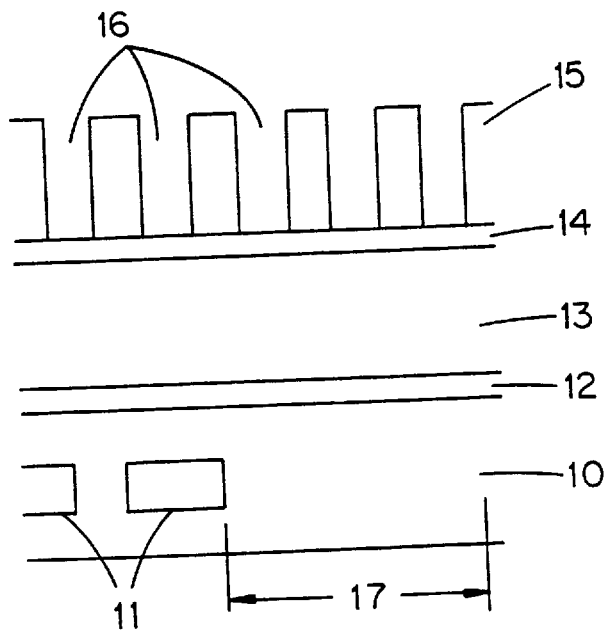
FIGS. 1A and 1B illustrate a prior art etching process for forming a dense array on a dielectric layer.

The present invention is directed to solving the undercutting problems which occur when etching a conductive layer to form a dense array of conductive lines, separated by distances less than 1.0 micron, particularly distances less than 0.7 microns, wherein the dense array of conductive lines is formed on a dielectric interlayer containing functional components within the dielectric layer, such as lower conductive lines. Upon extensive investigation and experimentation, I have observed that a differential etching species trajectory path occurs within a dense array of conductive lines formed on a dielectric interlayer extending over functional components and over a bordering region which does not contain functional components. For example, adverting to FIG. 1A, a dielectric layer 10, such as an oxide, preferably silicon dioxide, is formed on a substrate, such as a semiconductor substrate or another dielectric layer (not shown). Dielectric layer 10 contains functional components 11, such as a dense array of lower conductive lines. In the depicted prior art embodiment, a barrier layer 12, such as titanium, titanium nitride or titanium-tungsten, is initially formed on dielectric layer 10. A second metal layer, 13, such as aluminum or an aluminum alloy, is formed on barrier layer 12. An anti-reflective coating 14, such as titanium nitride, amorphous silicon, or SiON, is formed on second metal layer 13. Commercially available organic materials may be employed for the anti-reflective coatings, such as organic anti-reflective coatings which can be applied directly to second metal layer 12 or on a subsequently applied photo-resist layer 15. A photo-mask 15 is formed on the surface of anti-reflective coating 14, which photo mask comprises a pattern 16 defining a dense array of upper conductive lines.

Figure 1B:
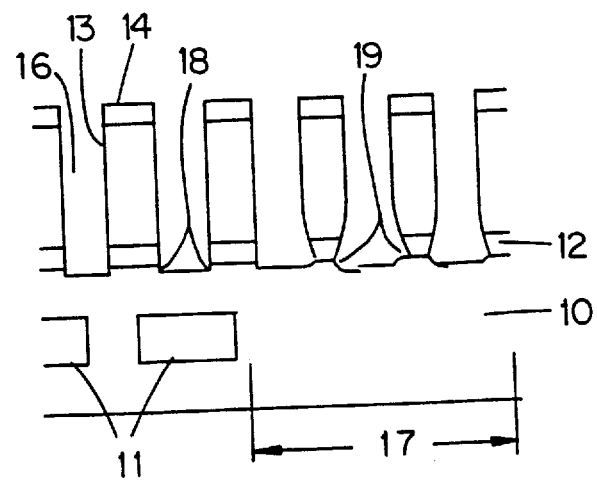

Etching is then conducted, typically employing a high density plasma, such as a chlorine plasma, until all metal and any residues between the conductive lines are removed, as shown in FIG. 1B. Such residues may, for example, comprise silicon and copper which are usually present in typical aluminum alloys employed for forming conductive lines in the semiconductor industry, or Ti or TiN from the barrier layer. Etching is continued until a portion of the underlying dielectric layer 10 is removed.

I have found that a differential etching species trajectory path occurs between conductive lines formed over functional circuit components 11 vis-à-vis conductive lines formed over a bordering open field 17. As shown in FIG. 1B, upon high density plasma etching to form upper conductive lines on dielectric layer 10 above functional lower conductive lines 11, no undercutting occurs as shown at 18. However, I have found that undercutting occurs between upper conductive lines of the dense array formed on dielectric layer 10 above the open field as shown at 19. Such undercutting also renders it difficult to fill spaces between the upper conductive lines, thereby generating voids where moisture can infiltrate. Moreover, as the conductive lines become progressively narrower, line resistance increases, and the danger of line breaking increases thereby reducing the reliability of the device with an attendant high rejection rate.

Thus, the present invention is directed to solving the undercutting problem which occurs when etching a conductive layer to form a dense array of conductive lines, typically separated by a distance less than 1.0 micron, preferably less than 0.7 microns, employing a conventional etching technique, such as a high density plasma technique, e.g., a high density chlorine plasma, wherein the dense array is formed on a dielectric layer containing functional circuit components, such as conductive lines, and wherein the dense array of conductive lines extends over the functional conductive wires and over a bordering open field.

As used throughout this application, the term "functional," when referring to components or conductive lines, denotes that the components or conductive lines are integrated in a circuit of the semiconductor device. As employed throughout this application, the expression "non-functional," when referring to components or conductive lines, denotes that the components or conductive lines are not integrated into a circuit of the semiconductor device and, hence, do not perform any electrical function. In other words, the "non-functional" components or conductive lines are "dummies" which occupy space in a semiconductor chip, but do not participate in any of the functions of the circuitry provided on the semiconductor chip.

Figure 2A:
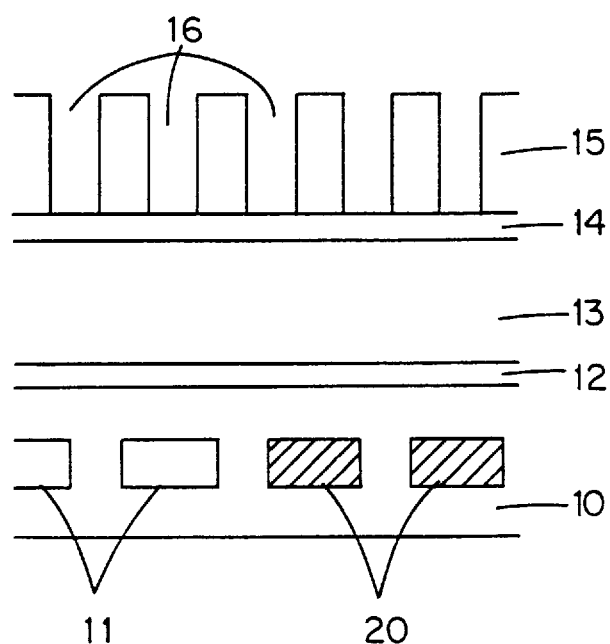
FIGS. 2A and 2B illustrate an embodiment of the present invention wherein undercutting is avoided.
Figure 2B:
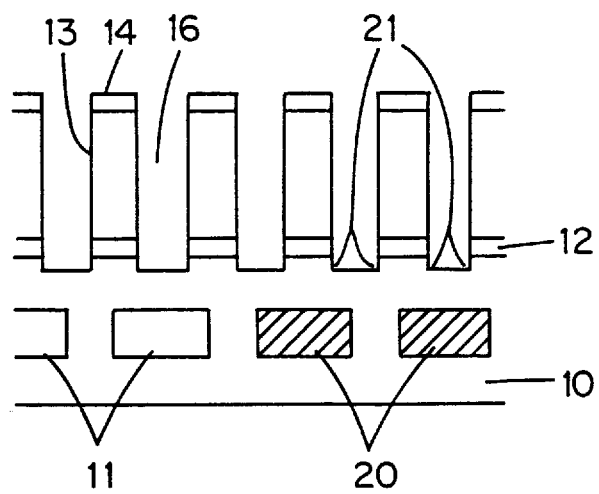

The present invention addresses and solves the problem of undercutting conductive lines of a dense array on a dielectric layer containing functional circuit components, such as a dense array of functional lower conductive lines bordered by an open field, wherein the dense array of conductive lines on the dielectric layer extends over the dense array of lower conductive lines and bordering open field, as indicated by undercutting 19 depicted in FIG. 1B. In accordance with the present invention, as schematically depicted in FIGS. 2A and 2B, wherein components similar to those in FIGS. 1A and 1B bear like reference numerals, one or more non-functional circuit components 20, such as one or more non-functional conductive lines, are formed in dielectric layer 10 in the bordering open field 17 (shown in FIGS. 1A and 1B). After high density plasma etching to form a dense array of upper conductive lines on dielectric layer 10, undercutting 19, which would ordinarily occur as shown in FIG. 1B, is avoided by virtue of providing one or more non-functional or dummy conductive lines 20, as shown in FIG. 2B. Upon microscopic examination of the resulting etched dense array, it was observed that the upper conductive lines formed on the dielectric layer 10 were essentially free of any undercutting above the one or more non-functional lower conductive lines 20 and above the functional lower conductive lines 11, as indicated at 21.

The reason for the differential etching species trajectory path occurring within a dense array of conductive lines on a dielectric layer which contains a dense array of lower conductive lines bordered by an open field, is not fully understood. It is believed that the parameters of the high density plasma etching technique are affected by the presence or absence of conductive lines in the underlying dielectric layer. It is further believed that the trajectory path is affected by the potential around the conductive line to be etched which, in turn, is affected by the presence of conductive material in the dielectric layer under the conductive line to be etched. By providing one or more nonfunctional or dummy conductive lines in the open field bordering the dense array of functional lower conductive lines in the dielectric layer, the undercutting problem which occurs in the upper dense array of conductive lines on the dielectric layer over the open field is avoided.

In accordance with the present invention, one or more non-functional or dummy components, preferably one or more conductive lines, is provided in an open field bordering a dense array of conductive lines to occupy open space within a dielectric layer. Upon forming a dense array of conductive lines on the dielectric layer overlying what would have been the open field, undercutting in the overlying dense array of conductive lines is avoided. The number of non-functional or dummy conductive lines employed can be easily optimized depending upon a particular situation for facilitating throughput and reducing cost. Generally, for an open field of approximately 2 microns, a single functional or dummy conductive line is all that can be provided, as a practical matter. For an open field in excess of 2 microns, one or more conductive lines can be provided depending upon the amount of space to be filled. In a preferred aspect of the present invention, a single non-functional or dummy line is employed to fill the entire open field, to reduce manipulative steps.

In carrying out the present invention, the distance between the lower conductive lines in the dielectric layer, including the functional and non-functional or dummy lower conductive line or lines, is preferably essentially the same, typically less than 1.0 micron, preferably less than 0.7 microns. The non-functional lower conductive line or lines bordering the dense array of lower conductive lines is typically greater than 2.0 microns. The distance between the upper conductive lines in the dielectric layer is also preferably the same, typically less than 1.0 micron, preferably less than 0.7 microns.

This invention can advantageously be used in combination with the non-functional or dummy conductive line or lines formed in an open field abutting the dense array of conductive lines formed on a dielectric layer, as disclosed in co-pending application Ser. No. 08/423,495 (Our Docket No. 1033-098). Thus, in another embodiment of the present invention, a portion of the upper conductive lines formed on the dielectric layer is integrated into an electric circuit extending over the functional and one or more non-functional lower conductive lines, leaving one or more non-functional upper conductive lines on the dielectric layer bordering the dense array of functional upper conductive lines.

A method of manufacturing a semiconductor device in accordance with an embodiment of the present invention comprises forming a first layer of conductive material on a substrate and forming a first mask on the first conductive layer, which first mask contains a pattern defining lines to constitute a dense array of functional lower conductive lines and bordering one or more non-functional lower conductive lines, preferably one nonfunctional conductive line. The first conductive layer is then etched through the mask, as by high density plasma etching, to form a plurality of lower conductive lines. A portion of the lower conductive lines is integrated into an electrical circuit leaving one or more bordering non-functional lower conductive lines. A dielectric layer is then deposited on the etched first conductive layer and planarized, as by chemical-mechanical polishing. A second conductive layer is then formed on the planarized dielectric layer, and a second mask is formed on the second conductive layer, which second mask contains a pattern defining lines to constitute a dense array of upper conductive lines. The second conductive layer is etched through the second mask to form a dense array of upper conductive lines. In another embodiment, a portion of the upper conductive lines is integrated in an electric circuit to form a dense array of functional upper conductive lines extending over the dense array of functional and one or more non-functional lower conductive lines, leaving one or more bordering non-functional upper conductive lines, thereby further avoiding undercutting of the upper conductive lines.

In carrying out the present invention, conventional methods of etching a conductive layer to form a dense array of conductive lines in terms of materials, equipment and basic manipulative steps can be employed. The present invention is generally applicable to the formation of dense arrays of conductive lines in multilevel semiconductor devices, and to various phases in the manufacture of semiconductor devices.

The semiconductor substrate may be any conventional semiconductor material, such as monocrystalline silicon. The dielectric layer can be formed by any conventional deposition technique, such as chemical vapor deposition or sputtering, and can comprise any dielectric material typically employed in the production of semiconductor devices, such as an oxide, preferably silicon dioxide. The conductive layer can be formed by any conventional deposition technique, such as a chemical vapor deposition or sputtering, and can comprise any conventional conductive material normally employed in the production of semiconductor devices, such as aluminum or an alloy, preferably an alloy containing titanium, copper and silicon, tungsten, tungsten silicide or polycrystalline silicon.

The present invention is applicable to the manufacturer of semiconductor devices, in various phases, wherein the semiconductor devices comprise a dense array of functional upper conductive lines formed on a dielectric layer and extending over functional and one or more non-functional conductive lines in the dielectric layer. In carrying out the present invention, high density plasma etching can be employed, such as high density chlorine plasma etching, utilizing conventional high density chlorine plasma etching equipment, such as Model 9600 commercially available from Lam Research Corp., Fremont, Calif.

Typically, the anti-reflective coating of the conductive layers has a thickness up to about 1100 Å; the barrier layer of a thickness of about 250 Å to about 1000 Å, and the second metal layer, such as aluminum or an aluminum alloy, a thickness of about 4000 Å to about 15000 Å.

It is also within the scope of the present invention to employ a composite barrier layer of titanium and titanium nitride. In such an embodiment, the titanium barrier layer can have a thickness of about 250 Å and the titanium nitride layer a thickness of about 350 Å.

Thus, in accordance with the present invention, undercutting of a dense array of upper conductive lines on a dielectric layer over a dense array of functional lower conductive lines within the dielectric layer bordered an open field is avoided by providing one or more non-functional lower conductive lines in the open field extending a distance of at least about 2.0 microns. The present invention effectively avoids undercutting of conductive lines within a dense array without requiring manipulation or adjustment of any etching parameters, the use of different etch recipes or additional equipment. The present invention is not limited to the particular materials previously mentioned or exemplified, but enjoys utility in the formation of any type of dense array comprising conductive lines.

Only the preferred embodiment of the invention and an example of its versatility is shown and described in the present disclosure. It is to be understood that the invention is capable of use in various other combinations and environments and is capable of changes or modifications within the scope of the inventive concept as expressed herein.

I claim:

1. A method of manufacturing a semiconductor device comprising:

forming a dielectric layer containing functional circuit components bordered by one or more selectively placed non-functional circuit components;

forming a layer of conductive material on the dielectric layer extending over the functional and over the one or more non-functional circuit components;

forming a mask on the conductive layer, which mask contains a pattern defining lines to constitute a dense array of upper conductive lines extending over the functional and one or more non-functional circuit components; and etching the conductive layer through the mask to form the dense array of upper conductive lines on the dielectric layer extending over the functional circuit components and over the one or more selectively placed non-functional circuit components, wherein all of the non-functional circuit components included in the device are disposed only directly under portions of the dense array of conductive lines, and a distance between upper conductive lines is less than about 1.0 micron.

2. The method according to claim 1, wherein the functional circuit components and one or more non-functional circuit components comprise lower conductive lines.

3. The method according to claim 2, wherein the non-functional lower conductive lines extend for a distance of at least 2.0 microns.

4. The method according to claim 2, further comprising forming an electrical circuit with a portion of the upper conductive lines to form a dense array of functional upper conductive lines leaving one or more bordering non-functional upper conductive lines.

5. The method according to claim 4, wherein the non-functional upper conductive lines extend for a distance of about 2.0 microns.

6. The method according to claim 1, wherein the distance between the upper conductive lines is essentially the same.

7. The method according to claim 6, wherein the distance between the lower conductive lines is essentially the same.

8. The method according to claim 7, wherein the distance between the lower conductive lines is less than about 1.0 micron.

9. The method according to claim 8, wherein the distance between the lower conductive lines is less than about 0.7 microns.

10. The method according to claim 1, wherein the distance between upper conductive lines is less than about 0.7 microns.

11. The method according to claim 1, wherein the dielectric layer comprises silicon dioxide.

12. The method according to claim 11, comprising depositing an electrically conductive barrier layer on the dielectric layer.

13. The method according to claim 12, wherein the barrier layer comprises titanium, titanium nitride or titanium-tungsten.

14. The method according to claim 1, comprising depositing an electrically conductive barrier layer on the dielectric layer.

15. The method according to claim 14, wherein the barrier layer comprises titanium, titanium nitride or titanium-tungsten.

16. A method of manufacturing a semiconductor device comprising:

forming a first layer of conductive material on a substrate;

forming a first mask on the first conductive layer, which first mask contains a pattern defining lines to constitute a dense array of functional lower conductive lines bordered by one or more non-functional lower conductive lines;

etching the first conductive layer through the mask to form a plurality of lower conductive lines; and forming an electrical circuit with a portion of the lower conductive lines to form the dense array of functional lower conductive lines leaving one or more bordering non-functional lower conductive lines;

depositing a layer of dielectric material;

planarizing the layer of dielectric material;

forming a second layer of conductive material on the dielectric layer extending over the dense array of functional lower conductive lines and over the one or more bordering non-functional lower conductive lines;

forming a second mask on the second conductive layer, which second mask contains a pattern defining lines to constitute a dense array of upper conductive lines extending over the dense array of functional lower conductive lines and over the one or more bordering non-functional lower conductive lines; and etching the second conductive layer through the mask to form the dense array of upper conductive lines extending directly over the dense array of functional lower conductive lines and extending directly over the one or more bordering non-functional lower conductive lines, wherein all of the non-functional conductive lines included in the device are disposed only directly under portions of the dense array of conductive lines.

17. The method according to claim 16, further comprising forming an electric circuit with a portion of the upper conductive lines to form a dense array of functional upper conductive lines extending over the functional and one or more non-functional lower conductive lines leaving one or more bordering non-functional upper conductive lines.

18. The method according to claim 16, comprising forming the first mask on the first conductive layer, which first mask contains a pattern defining lines to constitute a dense array of functional lower conductive lines bordered by one non-functional lower conductive line, forming an electrical circuit with a portion of the lower conductive lines to form the dense array of functional lower conductive lines leaving one bordering non-functional lower conductive line.

19. A method of manufacturing a semiconductor device comprising:

forming a first layer of conductive material on a substrate;

forming a first mask on the first conductive layer, which first mask contains a pattern defining lines to constitute a dense array of functional lower conductive lines bordered by one or more non-functional lower conductive lines;

etching the first conductive layer through the mask to form a plurality of lower conductive lines; and forming an electrical circuit with a portion of the lower conductive lines to form the dense array of functional lower conductive lines leaving one or more bordering non-functional lower conductive lines;

depositing a layer of dielectric material;

planarizing the layer of dielectric material;

forming a second layer of conductive material on the dielectric layer extending over the dense array of functional lower conductive lines and over the one or more bordering non-functional lower conductive lines;

forming a second mask on the second conductive layer, which second mask contains a pattern defining lines to constitute a dense array of upper conductive lines extending over the dense array of functional lower conductive lines and over the one or more bordering non-functional lower conductive lines; and etching the second conductive layer through the mask to form the dense array of upper conductive lines extending over the dense array of functional lower conductive lines and over the one or more bordering non-functional lower conductive lines, wherein all of the non-functional conductive lines included in the device are disposed only directly under portions of the dense array of conductive lines, and a distance between upper conductive lines is less than about 1.0 micron.

* * * * *